United States Patent
McFarthing

(10) Patent No.: US 9,397,385 B2
(45) Date of Patent: Jul. 19, 2016

(54) NEAR FIELD COMMUNICATIONS READER

(75) Inventor: Anthony McFarthing, Ely (GB)

(73) Assignee: Qualcomm Technologies International, Ltd., Cambridge (GB)

( * ) Notice: Subject to any disclaimer, the term of this patent is extended or adjusted under 35 U.S.C. 154(b) by 191 days.

(21) Appl. No.: 13/292,756

(22) Filed: Nov. 9, 2011

(65) Prior Publication Data
US 2013/0115876 A1 May 9, 2013

(51) Int. Cl.
| H04B 5/00 | (2006.01) |
| H01Q 1/22 | (2006.01) |
| H03F 3/195 | (2006.01) |
| H03F 3/24 | (2006.01) |
| H03F 3/45 | (2006.01) |
| G06K 7/10 | (2006.01) |

(52) U.S. Cl.
CPC .......... *H01Q 1/2216* (2013.01); *G06K 7/10158* (2013.01); *H03F 3/195* (2013.01); *H03F 3/245* (2013.01); *H03F 3/45475* (2013.01); *H04B 5/0062* (2013.01); *H03F 2203/45631* (2013.01); *H03F 2203/45641* (2013.01); *H03F 2203/45686* (2013.01); *H03F 2203/45702* (2013.01); *H03F 2203/45726* (2013.01)

(58) Field of Classification Search
CPC ..... H04W 8/005; H04W 88/06; H04W 76/02; G06F 1/1613; H04M 2250/02; H04B 5/02; H04B 5/0012; H04B 5/00
USPC .................. 455/41.1, 41.2, 41.3, 68; 340/10.4
See application file for complete search history.

(56) References Cited

U.S. PATENT DOCUMENTS

| 6,122,492 A * | 9/2000 | Sears .................. G06K 7/0008 330/124 R |
| 6,693,479 B1 * | 2/2004 | Bardsley ................. H02M 3/07 327/390 |
| 7,881,665 B2 * | 2/2011 | Symons ............. G06K 19/0723 455/41.1 |
| 7,995,965 B2 * | 8/2011 | Wuidart .................. H02M 1/10 455/41.1 |
| 8,489,020 B2 * | 7/2013 | Bangs .................. H04B 5/0012 343/867 |
| 8,564,371 B2 * | 10/2013 | Trulls Fortuny ..... H03G 1/0029 330/284 |
| 2002/0017980 A1 * | 2/2002 | Uozumi ................... H01Q 1/22 340/10.3 |
| 2004/0203361 A1 * | 10/2004 | Belcher ................. G01V 15/00 455/41.2 |
| 2005/0135817 A1 * | 6/2005 | Harms ............... H04B 10/6933 398/202 |

(Continued)

FOREIGN PATENT DOCUMENTS

| EP | 1160915 | 12/2001 |
| EP | 2367294 | 9/2011 |

(Continued)

OTHER PUBLICATIONS

Horowitz, P., et al., "The Art of Electronics", 2e, Cambridge Univ. Press, 1989, pp. 233-236.
(Continued)

*Primary Examiner* — MD Talukder
(74) *Attorney, Agent, or Firm* — Mahamedi Paradice LLP

(57) ABSTRACT

The present application relates to a near field communications (NFC) reader having a power amplifier which has an output that connects to an input terminal of an antenna by means of an antenna filter made up of one or more series resistors and one or more series capacitors. The NFC reader includes means for adjusting the Q factor of the antenna so as to increase the available transmit bandwidth and/or improve the efficiency of the reader. The means for adjusting the Q factor of the antenna may be, for example, a variable resistive component or one or more switches.

20 Claims, 4 Drawing Sheets

(56) References Cited

U.S. PATENT DOCUMENTS

| | | | | |
|---|---|---|---|---|
| 2006/0244630 A1* | 11/2006 | Finkenzeller | G06K 7/0008 | 340/870.07 |
| 2007/0026826 A1* | 2/2007 | Wilson | G06K 19/0723 | 455/130 |
| 2007/0129038 A1* | 6/2007 | Ragan | H04B 1/18 | 455/226.4 |
| 2007/0296548 A1* | 12/2007 | Hall | H03J 1/0008 | 340/10.1 |
| 2008/0246667 A1* | 10/2008 | Symons | G06K 19/0723 | 343/702 |
| 2009/0010360 A1* | 1/2009 | Murdoch | H03C 3/06 | 375/302 |
| 2010/0060370 A1* | 3/2010 | Chen | H03K 3/354 | 311/117 FE |
| 2010/0136911 A1* | 6/2010 | Sekita | H01Q 1/2208 | 455/41.2 |
| 2010/0148929 A1* | 6/2010 | Wu | G06K 7/0008 | 340/10.1 |
| 2010/0328045 A1* | 12/2010 | Goto | G06K 7/0008 | 340/10.4 |
| 2011/0205026 A1* | 8/2011 | Bateman | G06K 7/0008 | 340/10.1 |
| 2011/0291811 A1* | 12/2011 | Nakano | H04B 5/0093 | 340/10.4 |
| 2013/0062967 A1* | 3/2013 | Teggatz | H02J 5/005 | 307/104 |
| 2013/0109305 A1* | 5/2013 | Savoj | G06K 19/07749 | 455/41.1 |
| 2013/0112747 A1* | 5/2013 | McFarthing | H01Q 1/2225 | 235/439 |
| 2013/0115876 A1* | 5/2013 | McFarthing | G06K 74/10158 | 455/41.1 |
| 2013/0178154 A1* | 7/2013 | Zhu | H04M 1/7253 | 455/41.1 |

FOREIGN PATENT DOCUMENTS

| | | |
|---|---|---|
| JP | 2005-323178 | 11/2005 |
| JP | 2005323178 | * 11/2005 |
| JP | 2007-199871 | 8/2007 |
| WO | WO 2006/095186 | 9/2006 |
| WO | WO 2007/030864 | 3/2007 |

OTHER PUBLICATIONS

British Search Report issued Mar. 23, 2012 in corresponding GB1120192.8.

Search Report issued Apr. 2, 2014 in corresponding GB1120192.8.

\* cited by examiner

NEAR FIELD COMMUNICATIONS READER

TECHNICAL FIELD

The present application relates to a near field communications (NFC) reader.

BACKGROUND TO THE INVENTION

Near field communication (NFC) readers, used for transmission of data to compatible NFC devices such as NFC tags and the like, typically include an antenna having at its input an antenna filter for filtering out unwanted frequencies in a signal to be transmitted. The reader may be required to transmit data at rates up to 848 kbps. However, the bandwidth of the antenna filter may be as low as 300 kHz, which for higher-rate data contravenes the Nyquist-Shannon criteria, and can lead to significant levels of intersymbol interference (ISI) in the transmitted signal.

Most known NFC readers are designed to support a transmit data rate of 424 kbps whilst also being able to generate a strong magnetic field at the reader's transmit antenna. These dual requirements are achieved by using an antenna filter with a Q factor that is high enough to achieve a minimum field strength but not too high to prevent data reception.

Part of a typical known NFC system is shown schematically at 10 in FIG. 1. In the system of FIG. 1 an NFC reader 12 comprises a power amplifier 14 whose output is connected to input terminals of an antenna 16 by means of an amplifier filter made up of resistors 18a, 18b and capacitors 20a, 20b which are connected in series between differential outputs of the power amplifier 16 and the input terminals of the antenna 14.

An NFC tag 22 communicates with the reader 12 by means of an antenna 24, with the other components of the tag 22 being represented by a capacitor 26 and a resistor 28 connected in parallel with the antenna 24.

The resistors 18a, 18b and the capacitors 20a, 20b are of fixed value, and the loaded Q factor of the antenna 16 (i.e. the Q factor of the antenna when it is coupled to the tag antenna) of the reader 12 is determined by the total series resistance of the resistors 18a, 18b (as well as the series resistance of connecting components). As the resistors 18a, 18b are of fixed value, the loaded Q factor of the antenna is a fixed value, although during operation of the reader 12 the Q factor of the reader is affected by the value of the load on the tag 22. The loaded Q factor of the antenna 16 has a value $$Q = \frac{2\pi f_s L}{R_a + R_b},$$

where $f_s$ is the frequency of the transmitted signal, L is the inductance of the antenna 16, $R_a$ is the resistance of the series resistor 18a, and $R_b$ is the resistance of the series resistor 18b.

SUMMARY OF INVENTION

The present application relates to a near field communications (NFC) reader having a power amplifier having an output which connects to an input terminal of an antenna by means of an antenna filter made up of one or more series resistors and one or more series capacitors. The NFC reader includes means for adjusting the Q factor of the antenna so as to increase the available transmit bandwidth and/or improve the efficiency of the reader. In an embodiment, the means for adjusting the Q factor of the antenna is a variable resistive component connected in series between the output of the amplifier and the input of the antenna, which has the effect of varying the output impedance of the amplifier. Additionally or alternatively, the means for adjusting the Q factor of the antenna may comprise switches that can be activated to bypass the one or more series capacitors of the antenna filter.

According to a first aspect of the present invention there is provided a near field communications (NFC) reader comprising an amplifier for driving an antenna of the reader and an antenna filter, the reader further comprising means for varying the Q factor of the antenna.

Varying the Q factor of the antenna permits data with a wide range of data rates to be transmitted by the reader without intersymbol interference. Additionally, varying the Q factor can help to increase the efficiency of the reader in cases where high transmit power is not required.

The means for varying the Q factor of the antenna may comprise means for adjusting the output impedance of the amplifier.

For example, the means for varying the Q factor of the antenna may comprise an adjustable resistance connected between an output of the amplifier and the antenna.

The adjustable resistance may be provided by a plurality of selectable resistors.

Alternatively, the adjustable resistance may be provided by a plurality of electrically operable switches, each of which has an on-resistance.

As a further alternative, the adjustable resistance may be provided by a digital potentiometer or resistive digital to analogue converter.

Additionally or alternatively, the variable resistive component could be produced by means of suitable shunt or series feedback around the power amplifier without using additional components.

Alternatively, the means for varying the Q factor of the antenna may comprise a variable transconductance ($g_m$) cascode stage in the power amplifier.

The near field communications reader may further comprise a controller configured to receive an indication of the data rate of data to be transmitted and to control the means for adjusting the output impedance of the amplifier to accommodate transmission of the data at the indicated data rate.

The antenna filter may comprise a capacitance connected in series between an output of the amplifier and an input of the antenna, and the near field communications reader may further comprise means for bypassing the capacitance.

According to a second aspect of the invention there is provided a near field communications reader comprising an amplifier for driving an antenna of the reader and an antenna filter comprising a capacitance connected in series between an output of the amplifier and an input of the antenna, the near field communications reader further comprising means for bypassing the capacitance.

Bypassing the capacitance has the effect of flattening the frequency response of the antenna filter, thereby permitting transmission of data at higher data rates than can usually be transmitted by an NFC reader without intersymbol interference.

The means for bypassing the capacitance may comprise a switch connected in parallel with the capacitance such that when activated the switch short circuits the capacitance.

The near field communications reader may further comprise a controller for controlling the operation of the switch according to the data rate of data to be transmitted by the near field communications reader.

BRIEF DESCRIPTION OF THE DRAWINGS

Embodiments of the invention will now be described, strictly by way of example only, with reference to the accompanying drawings, of which

DESCRIPTION OF THE EMBODIMENTS

Figure 1:
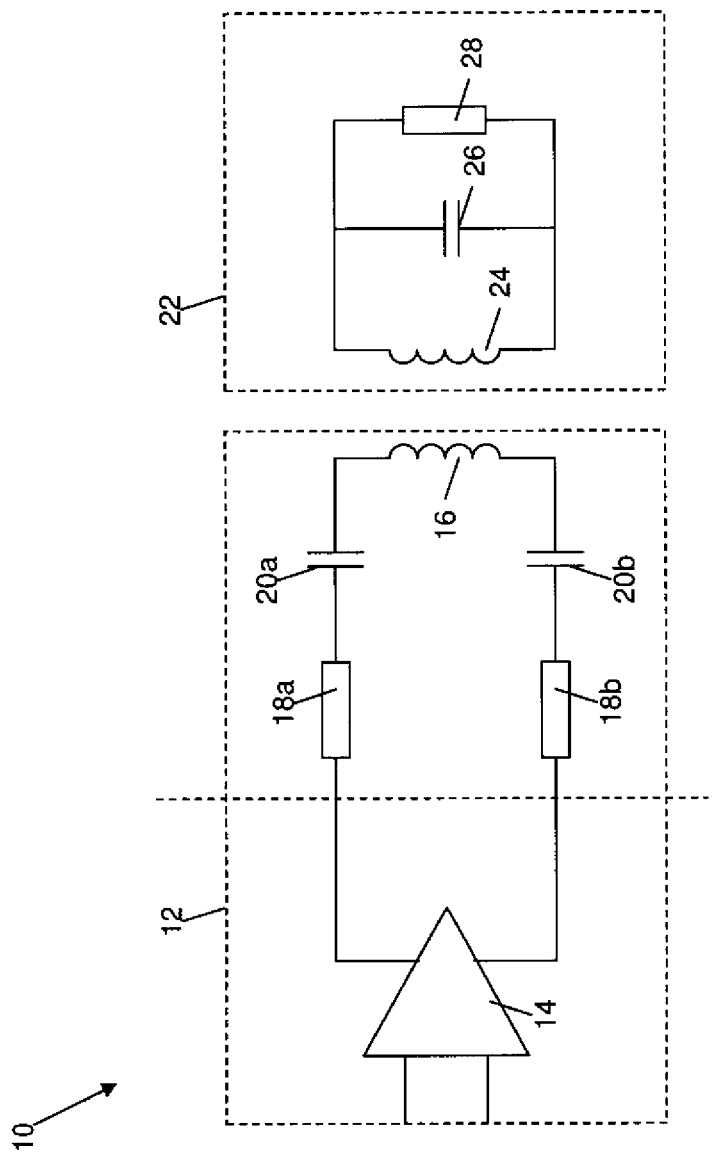
FIG. 1 is a schematic representation of a known NFC reader and tag.
Figure 2:
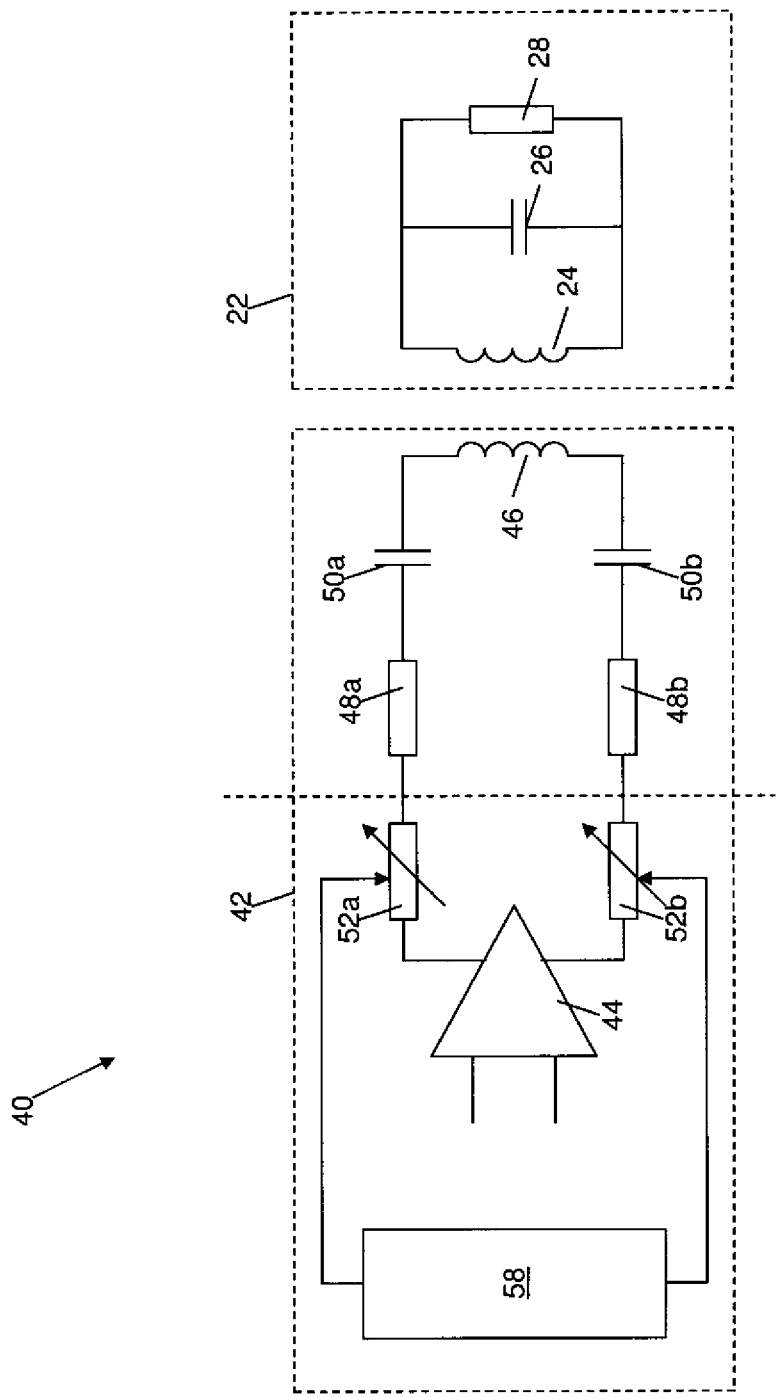
FIG. 2 is a schematic representation of an NFC reader according to one embodiment of the present invention.

Referring first to FIG. 2, an NFC system incorporating an NFC reader according to one embodiment is shown generally at 40. As in the embodiment illustrated in FIG. 1, the NFC reader 42 comprises a power amplifier 44 whose output is connected to input terminals of an antenna 46 by means of an antenna filter made up of resistors 48a, 48b and capacitors 50a, 50b which are connected in series between differential outputs of the power amplifier 44 and the input terminals of the antenna 46. The NFC reader 42 is able to transmit a data signal to a compatible NFC device such as the tag 22 illustrated in FIG. 1, which is reproduced in FIG. 2.

The power amplifier 44 in the embodiment illustrated in FIG. 2 is implemented as part of an integrated circuit (i.e. is an "on-chip" component), whilst the resistors 48a, 48b and capacitors 50a, 50b which make up the antenna filter, and the antenna 46, are off-chip components (i.e. they are external to the integrated circuit containing the power amplifier 42). The dashed line in FIG. 2 represents the border between on-chip and off-chip components.

The NFC reader 42 of FIG. 2 includes on-chip variable resistive components 52a, 52b connected to the differential outputs of the power amplifier 44, which effectively enable the output impedance of the power amplifier 44 to be adjusted to vary the Q factor of the antenna 46 to accommodate different data rates, as will be described below.

Figure 3:
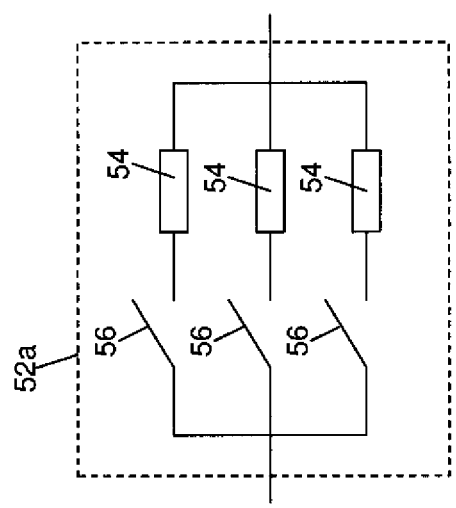
FIG. 3 is a schematic representation of a bank of switchable resistors which may be used as a variable resistive component in the NFC reader illustrated in FIG. 2.

In FIG. 2 these on-chip variable resistive components 52a, 52b are shown as variable resistors, but it is to be appreciated that these components may be implemented in a variety of ways. For example, the variable resistive components could be implemented as one or more resistive digital to analogue converters (RDACs, also referred to a digital potentiometers). Alternatively, the on-chip resistive components 52a, 52b could be implemented as banks of resistors 54 that can be selectively connected to the outputs of the amplifier 44 by means of switches 56 such as transistors, as is illustrated schematically in FIG. 3. As a further alternative, the resistors 54 could be omitted, with the resistance being provided only by the series resistance of the switch (e.g. the collector-emitter resistance in the case where the switch is a bipolar junction transistor, or the drain-source resistance in the case where the switch is a field effect transistor).

Since the variable resistive components 52a, 52b are in series with the resistors 48a, 48b of the antenna filter, they can be used to adjust the Q factor of the antenna 46. For example, where a higher transmission bandwidth is required, the Q factor can be reduced by increasing the resistance of the variable resistive components 52a, 52b. Similarly, if a lower transmission bandwidth is required, the Q factor can be increased by reducing the resistance of the variable resistive components 52a, 52b. This also has the effect of increasing the efficiency of the reader 42, since at a high Q factor more of the power of the signal output by the amplifier 44 is transmitted by the antenna 46, and so for a given transmitted signal power a lower power input is required at the amplifier 44.

To achieve this adjustment of the Q factor of the antenna 44, the reader 42 includes a controller 58 which receives an indication of the data rate of the data to be transmitted, and controls the resistance of the variable resistive components 52a, 52b, e.g. by switching on selected ones of the switches 56, to adjust the loaded Q factor of the antenna 46 to enable the transmission of the data at the desired data rate. In this way the loaded Q factor of the antenna 46 can be adjusted to provide sufficient transmit bandwidth to transmit the data at the required data rate without contravening the Nyquist-Shannon criteria, thus reducing or negating the problem of high levels of intersymbol interference in the transmitted signal.

In some embodiments the power amplifier 44 may be provided with shunt or series feedback as will be familiar to those skilled in the art. The shunt and/or series feedback may be adjustable, thus providing a variable resistive component without requiring any additional resistive components. The adjustable shunt or series feedback thus provides an additional or alternative means for adjusting the Q factor of the antenna 46.

Additionally or alternatively, the power amplifier 44 may include a variable transconductance ($g_m$) cascode stage, such that adjustment of the variable transconductance provides an additional or alternative means for adjusting the Q factor of the antenna 46.

Figure 4:
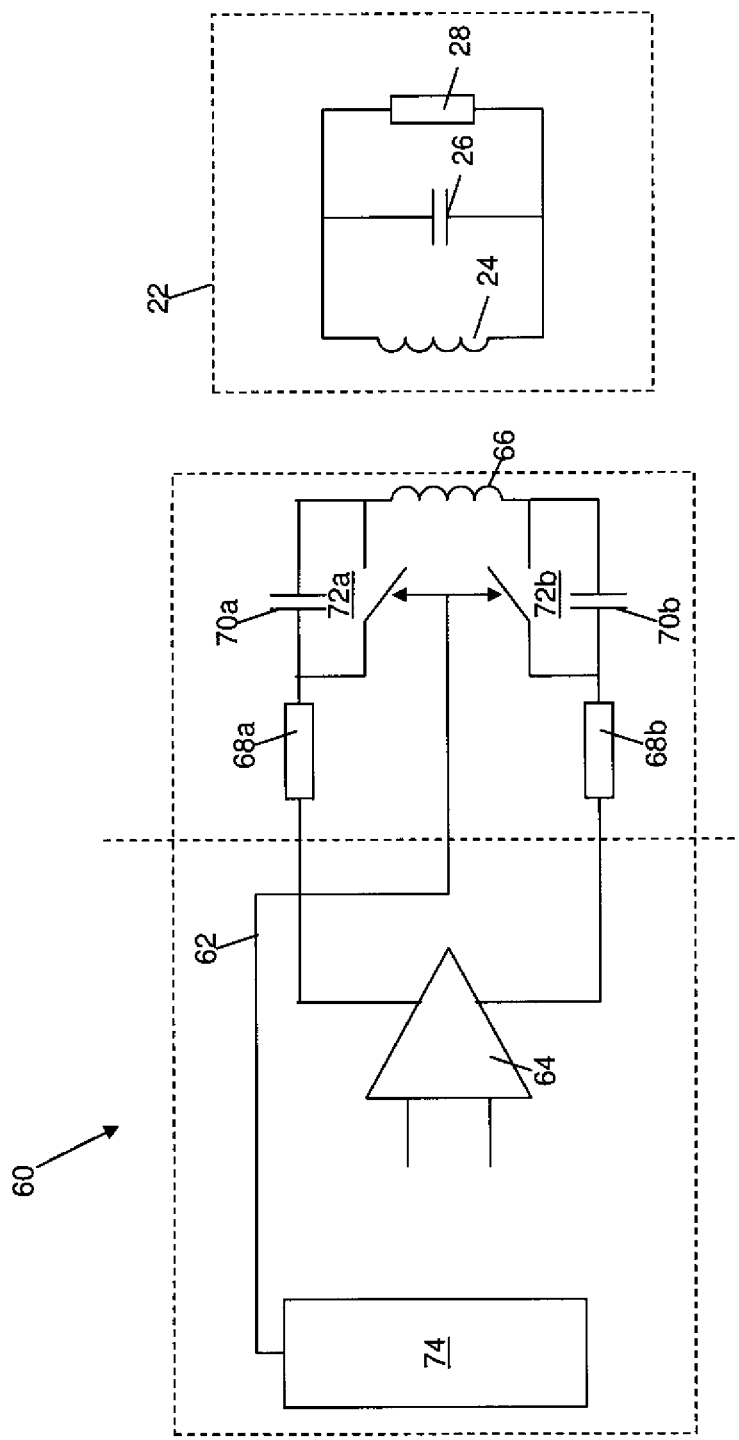
FIG. 4 is a schematic representation of an NFC reader according to an alternative embodiment of the present invention.

Referring now to FIG. 4, an NFC reader according to a further embodiment is shown generally at 60. In the embodiment illustrated in FIG. 4 an NFC reader 62 comprises a power amplifier 64 whose output is connected to input terminals of an antenna 66 by means of an antenna filter made up of resistors 68a, 68b and capacitors 70a, 70b which are connected in series between differential outputs of the power amplifier 64 and the input terminals of the antenna 66. The NFC reader 62 is able to transmit a data signal to a compatible NFC device such as the tag 22 illustrated in FIG. 1, which is reproduced in FIG. 4.

As in the previous embodiment, the power amplifier 64 in the embodiment illustrated in FIG. 4 is implemented as part of an integrated circuit (i.e. is an "on-chip" component), whilst the resistors 68a, 68b and capacitors 70a, 70b which make up the antenna filter, and the antenna 66, are off-chip components (i.e. they are external to the integrated circuit containing the power amplifier 62). The dashed line in FIG. 4 represents the border between on-chip and off-chip components.

The NFC reader 62 of FIG. 4 includes off-chip switches 72a, 72b connected in parallel with the capacitors 70a, 70b between the resistors 68a, 68b and the terminals of the antenna 66. The switches 72a, 72b can be activated to connect the resistors 68a, 68b directly to the terminals of the antenna 66, i.e. when activated the switches 72a, 72b short circuit the capacitors 70a, 70b. Bypassing the capacitors 70a, 70b in this way effectively flattens the frequency response of the antenna filter, which increases the bandwidth available for data transmission, at the expense of reducing the Q factor of the antenna 66 by a large amount. This arrangement is particularly useful where data is to be transmitted between two powered devices such as mobile telephones, where higher transmission data rates are more important than high Q factor, as the transmitted data signal need not be high power, since the receiving device is powered.

As in the embodiment illustrated in FIG. 2, the reader 62 of the embodiment illustrated in FIG. 4 includes a controller 74 which receives an indication of the data rate of date to be transmitted. If this data rate meets a predetermined condition, e.g. if the data rate exceeds a particular threshold, the controller 74 causes the switches 72a, 72b to close, causing the capacitors 70a, 70b to be bypassed (short-circuited), thereby increasing the transmit bandwidth of the antenna 66.

It will be appreciated that the features illustrated in FIGS. 2 and 4 are complementary. In other words, the reader 42 of FIG. 2 may be provided with the switches 72a, 72b illustrated in FIG. 4, in which case the controller 58 controls not only the variable resistive components 58a, 58b, but also the switches 72a, 72b.

The invention claimed is:

1. A near field communications (NFC) reader, comprising:
   an amplifier configured to drive an antenna of the NFC reader;
   a first antenna filter comprising a first variable resistance and a first capacitor connected in series with the antenna;
   a first switch connected in parallel with the first capacitor;
   a controller configured to:
     adjust a quality factor of the antenna by adjusting the first variable resistance; and
     control an operation of the first switch based on a data rate of data to be transmitted by the NFC reader;
   a second antenna filter comprising a second variable resistance and a second capacitor connected in series with the antenna; and
   a second switch connected in parallel with the second capacitor and configured to increase the bandwidth available for data transmission by the NFC reader by short-circuiting the second capacitor.

2. The NFC reader of claim 1, wherein the first variable resistance is provided by a plurality of first selectable resistors.

3. The NFC reader of claim 1, wherein the first variable resistance is provided by a plurality of first electrically operable switches, each of which includes an on-resistance.

4. The NFC reader of claim 1, wherein the first variable resistance is provided by a first digital potentiometer or a first resistive digital to analogue converter.

5. The NFC reader of claim 1, wherein the first variable resistance is provided by first shunt or series feedback around the amplifier.

6. The NFC reader of claim 1, wherein the controller is further configured to receive an indication of the data rate of the data to be transmitted and to adjust the first variable resistance based on the indicated data rate.

7. The NFC reader of claim 1, the controller further configured to:
   adjust the quality factor of the antenna by adjusting the second variable resistance; and
   control an operation of the second switch based on the data rate.

8. The NFC reader of claim 1, wherein the second variable resistance is provided by a plurality of second selectable resistors.

9. The NFC reader of claim 1, wherein the second variable resistance is provided by a plurality of second electrically operable switches, each of which includes an on-resistance.

10. The NFC reader of claim 1, wherein the second variable resistance is provided by a second digital potentiometer or a second resistive digital to analogue converter.

11. The NFC reader of claim 1, wherein the second variable resistance is provided by second shunt or series feedback around the amplifier.

12. The NFC reader of claim 1, wherein the controller is further configured to receive an indication of the data rate of the data to be transmitted and to adjust the second variable resistance based on the indicated data rate.

13. A near field communications (NFC) reader, comprising:
   an antenna including a first terminal and a second terminal;
   a differential amplifier including a first terminal and a second terminal;
   a single first variable resistor and a single first capacitor connected in series between the first terminal of the differential amplifier and the first terminal of the antenna;
   a first switch connected in parallel with the single first capacitor;
   a single second variable resistor and a single second capacitor connected in series between the second terminal of the differential amplifier and the second terminal of the antenna;
   a second switch connected in parallel with the single second capacitor; and
   a controller, coupled to the first and second switches, and configured to:
   adjust a transmission bandwidth of the antenna, based on a data rate of data to be transmitted from the NFC reader, by short-circuiting the single first and second capacitors using the first and second switches, respectively.

14. The NFC reader of claim 13, the controller further configured to adjust the transmission bandwidth by adjusting at least one of the single first variable resistor and the single second variable resistor.

15. The NFC reader of claim 13, wherein:
   the single first variable resistor and the single first capacitor form a first filter; and
   the single second variable resistor and the single second capacitor form a second filter.

16. A near field communications (NFC) reader, comprising:
   a first adjustable filter coupled between a first terminal of an antenna and a first terminal of a differential amplifier, the first adjustable filter comprising:
     a first variable resistor and a first capacitor connected in series between the first terminal of the differential amplifier and the first terminal of the antenna; and
     a first switch connected in parallel with the first capacitor;
   a second adjustable filter coupled between a second terminal of the antenna and a second terminal of the differential amplifier, the second adjustable filter comprising:
     a second variable resistor and a second capacitor connected in series between the second terminal of the differential amplifier and the second terminal of the antenna; and
     a second switch connected in parallel with the second capacitor; and
   a controller, coupled to the first and second adjustable filters, configured to adjust a transmission bandwidth of data to be transmitted from the NFC reader by short-circuiting the first and second capacitors using the first and second switches, respectively.

17. The NFC reader of claim 16, the controller further configured to adjust the transmission bandwidth by adjusting at least one of the first variable resistor and the second variable resistor.

18. The NFC reader of claim 16, the controller further configured to receive an indication of a data rate of the data to be transmitted and to adjust at least one of the first variable resistor and the second variable resistor based on the indicated data rate.

19. The NFC reader of claim 16, wherein the first variable resistor comprises a first plurality of selectable resistors, and the second variable resistor comprises a second plurality of selectable resistors.

20. The NFC reader of claim 16, wherein the first variable resistor comprises a first digital potentiometer or a first resistive digital to analogue converter, and the second variable resistor comprises a second digital potentiometer or a second resistive digital to analogue converter.

\* \* \* \* \*